(12) United States Patent
Ji et al.

(10) Patent No.: US 10,373,949 B2
(45) Date of Patent: Aug. 6, 2019

(54) SEMICONDUCTOR DEVICE AND MANUFACTURING METHOD THEREOF

(71) Applicant: MEDIATEK Inc., Hsin-Chu (TW)

(72) Inventors: Yan-Liang Ji, Hsinchu (TW); Cheng-Hua Lin, Hsinchu (TW); Chih-Chung Chiu, Miaoli County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/677,190

(22) Filed: Aug. 15, 2017

(65) Prior Publication Data

US 2018/0240794 A1  Aug. 23, 2018

Related U.S. Application Data

(60) Provisional application No. 62/460,933, filed on Feb. 20, 2017.

(51) Int. Cl.
*H01L 27/06* (2006.01)
*H01L 29/06* (2006.01)
*H01L 23/528* (2006.01)
*H01L 21/8234* (2006.01)
*H01L 29/66* (2006.01)
*H01L 49/02* (2006.01)

(52) U.S. Cl.
CPC .. *H01L 27/0629* (2013.01); *H01L 21/823475* (2013.01); *H01L 21/823481* (2013.01); *H01L 23/528* (2013.01); *H01L 29/0649* (2013.01); *H01L 29/665* (2013.01); *H01L 27/0617* (2013.01); *H01L 28/20* (2013.01)

(58) Field of Classification Search
CPC ..... H01L 21/823475; H01L 21/823481; H01L 27/0629; H01L 27/0617; H01L 23/528; H01L 29/0649; H01L 28/20
See application file for complete search history.

(56) References Cited

U.S. PATENT DOCUMENTS

| | | | |
|---|---|---|---|
| 7,855,422 B2 * | 12/2010 | Hu | H01L 27/0629 257/379 |
| 9,871,132 B1 * | 1/2018 | Liu | H01L 29/7816 |
| 2008/0017933 A1 | 1/2008 | Kao | |
| 2010/0163947 A1 | 7/2010 | Lee | |

(Continued)

FOREIGN PATENT DOCUMENTS

JP    2011204997 A    10/2011

OTHER PUBLICATIONS

Wolf S: "Polycides and Salicides of TiSi2, CoSi2, and NiSi"; Silicon Processing for the VLS1 ERA≥vol. IV; Chapter 13; Jan. 2002 (Jan. 2002); pp. 603-638.

(Continued)

*Primary Examiner* — Cheung Lee
*Assistant Examiner* — Stephen C Smith
(74) *Attorney, Agent, or Firm* — McClure, Qualey & Rodack, LLP

(57) ABSTRACT

A semiconductor device includes a semiconductor substrate and a passive component. The passive component is formed on the semiconductor substrate and includes a first polysilicon (poly) layer, a salicide blockage (SAB) layer and a first salicide layer. The SAB layer is formed on the first poly layer. The first salicide layer is formed on the SAB layer.

12 Claims, 5 Drawing Sheets

(56) References Cited

U.S. PATENT DOCUMENTS

2013/0181307 A1* 7/2013 Ohta ................ H01L 31/1136
 257/431
2016/0211363 A1* 7/2016 Park ................ H01L 29/66825

OTHER PUBLICATIONS

EPO Search Report dated Feb. 20, 2018 in European application (No. 17189162.5-1212).

\* cited by examiner

SEMICONDUCTOR DEVICE AND MANUFACTURING METHOD THEREOF

This application claims the benefit of U.S. Provisional application Ser. No. 62/460,933, filed Feb. 20, 2017, the disclosure of which is incorporated by reference herein in its entirety.

FIELD OF THE INVENTION

The invention relates to a semiconductor device and a manufacturing method thereof, and more particularly to a semiconductor device having a salicide layer and a manufacturing method thereof.

BACKGROUND OF THE INVENTION

Conventional electronic device includes a passive component and a circuit. The passive component usually generates parasitic electricity, such as parasitic resistance, parasitic capacitance and/or parasitic inductance. However, such parasitic electricity or parasitic element interferes with the circuit. Therefore, it is important to reduce the interference from the passive component.

SUMMARY OF THE INVENTION

In one embodiment of the invention, a semiconductor device is provided. The semiconductor device includes a semiconductor substrate and a passive component. The passive component is formed on the semiconductor substrate and includes a first polysilicon (poly) layer, a salicide blockage (SAB) layer and a first salicide layer. The SAB layer is formed on the first poly layer. The first salicide layer is formed on the SAB layer.

In another embodiment of the invention, a manufacturing method of a semiconductor device. The manufacturing method includes the following steps. A semiconductor substrate is provided, wherein a first poly layer is formed on the semiconductor substrate, a SAB layer is formed on the first poly layer, and a second poly layer is formed on the SAB layer; a reaction layer covering the second poly layer is formed; the second poly layer is reacted with the reaction layer to form a first salicide layer; and the reaction layer is removed.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
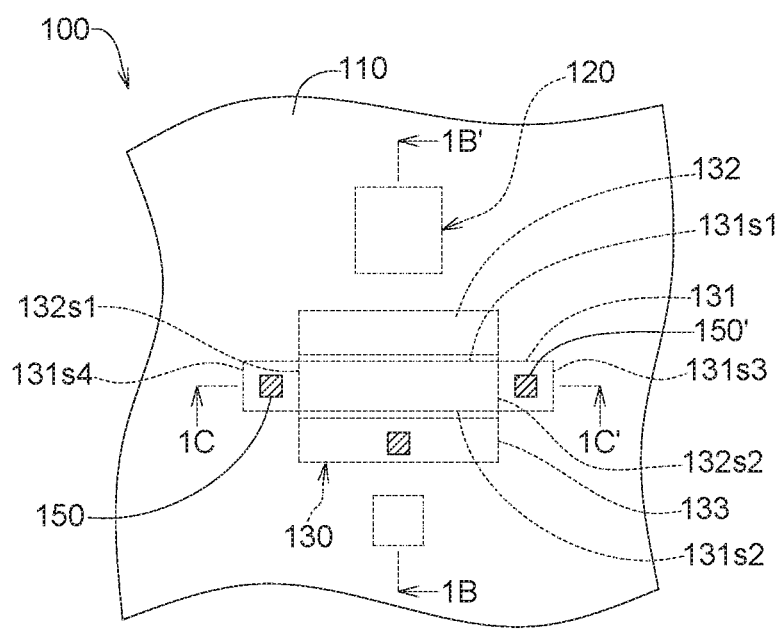
FIG. 1A illustrates a diagram of a semiconductor device according to an embodiment of the invention.
Figure 1B:
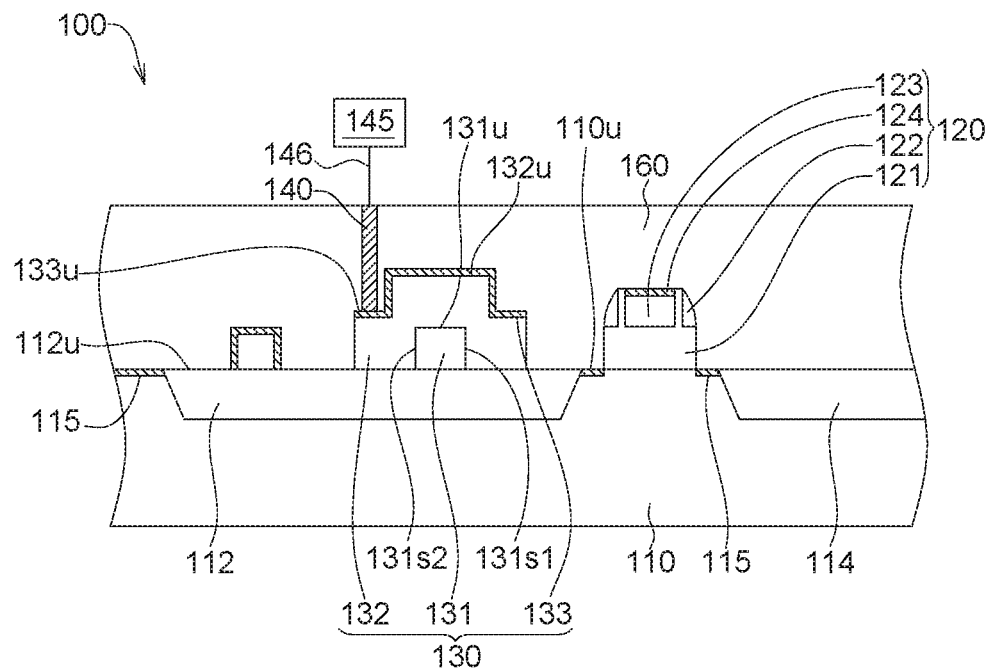
FIG. 1B illustrates a cross-sectional view of the semiconductor device of FIG. 1A along a direction 1B-1B'.
Figure 1C:
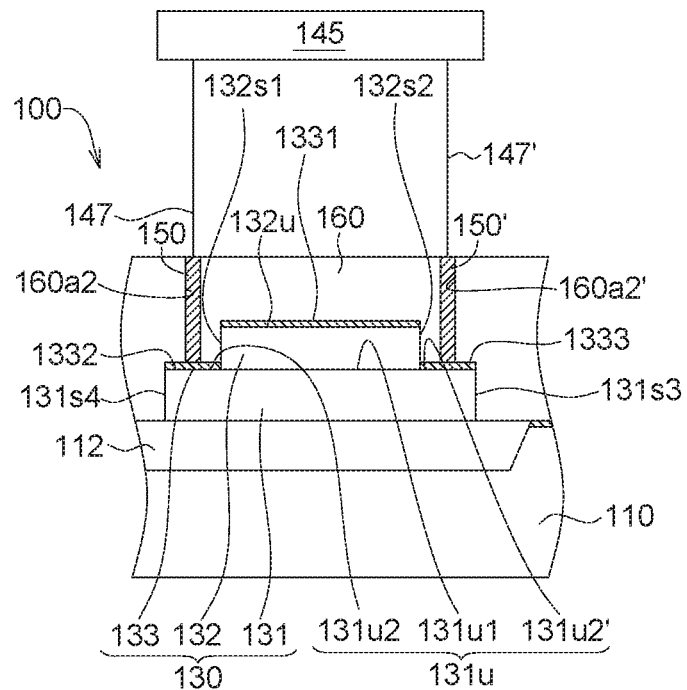
FIG. 1C illustrates a cross-sectional view of the semiconductor device of FIG. 1A along a direction 1C-1C'.

FIG. 1A illustrates a diagram of a semiconductor device 100 according to an embodiment of the invention, FIG. 1B illustrates a cross-sectional view of the semiconductor device 100 of FIG. 1A along a direction 1B-1B', and FIG. 1C illustrates a cross-sectional view of the semiconductor device 100 of FIG. 1A along a direction 1C-1C'.

The semiconductor device 100 is, for example, a memory device, such as a metal-oxide-semiconductor (MOS) device, etc. The semiconductor device 100 includes a semiconductor substrate 110, a first isolation portion 112, a second isolation portion 114, at least one metal-oxide-semiconductor (MOS) 120, a passive component 130, a first contact 140, a controller 145, a second contact 150, a third contact 150' and a layer structure 160.

The semiconductor substrate 110 is, for example, a silicon wafer. The semiconductor substrate 110 has an upper surface 110$u$. The first isolation portion 112 and the second isolation portion 114 are embedded in the semiconductor substrate 110 and exposed from the upper surface 110$u$. In an embodiment, the first isolation portion 112 and the second isolation portion 114 are shallow trench isolations (STI) made of $SiO_x$ or $SiN_x$, for example.

The MOS 120 is formed above the upper surface 110$u$ of the semiconductor substrate 110. The MOS 120 includes a gate insulation layer 121, a spacer 122 and a poly layer 123, wherein the gate insulation layer 121 separates the poly layer 123 from the semiconductor substrate 110. The gate insulation layer 121 may be made of, for example, oxide, and the gate insulation layer 121 may be made of, for example, $SiN_x$.

As illustrated in FIG. 1B, the passive component 130 is formed above an upper surface 112$u$ of the first isolation portion 112. The passive component 130 includes a first poly layer 131, a SAB layer 132 and a first salicide layer 133. The SAB layer 132 is formed on the first poly layer 131 formed above the upper surface 112$u$, and the first salicide layer 133 is formed on the SAB layer 132.

In addition, the first salicide layer 133 is formed by reacting a second poly layer with a reaction layer made of titanium, nickel, copper or a combination of thereof. The semiconductor substrate 110 further includes a second salicide layer 115, and the MOS 120 further includes a third salicide layer 124, wherein the first salicide layer 133, the second salicide layer 115 and the third salicide layer 124 are the same layer structure formed in the same process.

As illustrated in FIGS. 1A and 1B, the first poly layer 131 has a second upper surface 131$u$ and a first lateral surface 131$s$1 and a second lateral surface 131$s$2 opposite to the first lateral surface 131$s$1. The SAB layer 132 covers a portion of the second upper surface 131$u$, a portion of the first lateral surface 131$s$1 and a portion of the second lateral surface 131$s$2. The first salicide layer 133 is formed on a third upper surface 132$u$ of the SAB layer 132.

As illustrated in FIG. 1C, the first poly layer 131 further has a third lateral surface 131$s$3 and a fourth lateral surface 131$s$4 opposite to the third lateral surface 131$s$3. In this cross-sectional view, the SAB layer 132 covers a first portion 131$u$1 of the second upper surface 131$u$, but exposes a second portion 131$u$2 of the second upper surface 131$u$, the third lateral surface 131$s$3 and the fourth lateral surface 131$s$4. In addition, the first salicide layer 133 is formed on the third upper surface 132$u$ of the SAB layer 132 and the second portion 131$u$2 of the second upper surface 131$u$.

As illustrated in FIG. 1C, the first salicide layer 133 includes a first salicide portion 1331 formed on the SAB layer 132, a second salicide portion 1332 formed on the first poly layer 131 and a third salicide portion 1333 formed on the first poly layer 131. The first salicide portion 1331 is separated from the second salicide portion 1332 by a fifth lateral surface 132s1 of the SAB layer 132 and separated from the third salicide portion 1333 by a sixth lateral surface 132s2 of the SAB layer 132, wherein the fifth lateral surface 132s1 is opposite to the sixth lateral surface 132s2.

As illustrated in FIG. 1B, the first contact 140 is formed on a first upper surface 133u of the first salicide layer 133 covering the SAB layer 132 and electrically connecting to a controller 145 through a first conductive wire 146. The controller 145 may provide the passive component 130 with a constant voltage or a controllable voltage. The first salicide layer 133 can isolates the passive component 130 from a circuit (not illustrated) formed above the layer structure 160 for preventing parasitic electricity (such as parasitic resistance, parasitic capacitance and/or parasitic inductance) of the passive component 130 from interfering with the circuit. According to simulation, the total harmonic distortion (THD) can be reduced by 10 dB due the isolation of the first salicide layer 133.

In terms of controllable voltage, the controller 145 may control the voltage applied to the first salicide layer 133 to change through the first contact 140. In terms of constant voltage, the controller 145 may control the voltage applied to the first salicide layer 133 through the first contact 140 for maintaining a steady voltage difference between the first salicide layer 133 and the first poly layer 131. For example, the larger the voltage applied to the first poly layer 131 is, the larger the voltage applied to the first salicide layer 133 is. As a result, the voltage difference between the first salicide layer 133 and the first poly layer 131 may be kept in a constant voltage difference, and accordingly it can avoid any disadvantageous or unexpected influence due to the change of voltage difference.

Similarly, as illustrated in FIG. 1C, the second contact 150 is formed on the second salicide portion 1332 of the first salicide layer 133 covering the second portion 131u2 of the first poly layer. 131 and electrically connecting to the controller 145 through a second conductive wire 147. The third contact 150' is formed on the third salicide portion 1333 of the first salicide layer 133 covering the second portion 131u2' of the first poly layer. 131 and electrically connecting to the controller 145 through a third conductive wire 147'. The second portion 131u2 and the third portion 131u2' are located opposite two sides of the SAB layer 132 and separated from each other by the SAB layer 132.

As illustrated in FIG. 1C, the controller 145 may control the voltage applied to the first salicide layer 133 through the second contact 150 and/or the third contact 150' to change or for maintaining a steady voltage difference between the first salicide layer 133 and the first poly layer 131.

In another embodiment, one of the first contact 140 and the second contact 150 may be omitted. In other embodiment, the first contact 140 and the second contact 150 may be omitted, such that the passive component 130 is electrically separated from the controller 145. Even if the first salicide layer 133 may be electrically separated from the controller 145, the first salicide layer 133 still can isolate the passive component 130 from a circuit formed above the layer structure 160 for preventing parasitic electricity of the passive component 130 from interfering with the circuit.

FIGS. 2A to 2F illustrate manufacturing processes of the semiconductor device 100 of FIG. 1B.

Figure 2A:
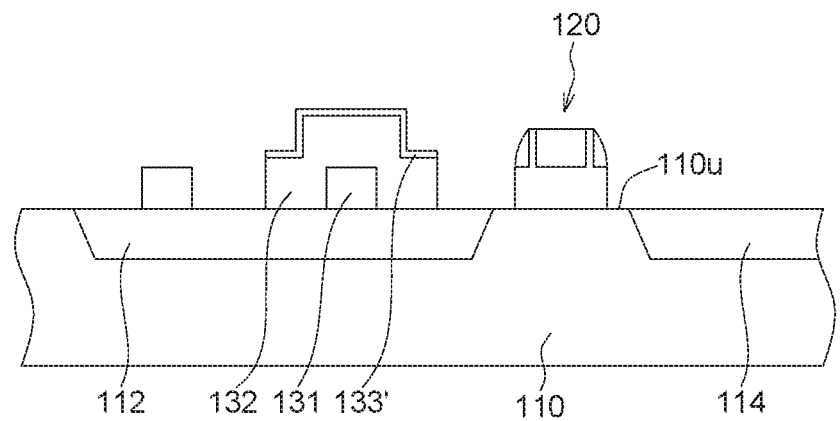
FIGS. 2A to 2F illustrate manufacturing processes of the semiconductor device of FIG. 1B.

Referring to FIG. 2A, the semiconductor substrate 110 is provided, wherein the first isolation portion 112 and the second isolation portion 114 are embedded in the semiconductor substrate 110, the first poly layer 131 is formed on the semiconductor substrate 110, the SAB layer 132 is formed on the first poly layer 131, the second poly layer 133' is formed on the SAB layer 132 and the first poly layer 131, and the MOS 120 is formed above the upper surface 110u of semiconductor substrate 110. In this step, the second poly layer 133' includes a first poly portion formed on the SAB layer 132 and a second poly portion formed on the first poly layer 131, wherein the covering region of the first poly portion is the same as that of the first salicide portion 1331 of FIG. 1C, and the covering region of the second poly portion is the same as that of the second salicide portion 1332 and the third salicide portion 1333 of FIG. 1C.

Figure 2B:
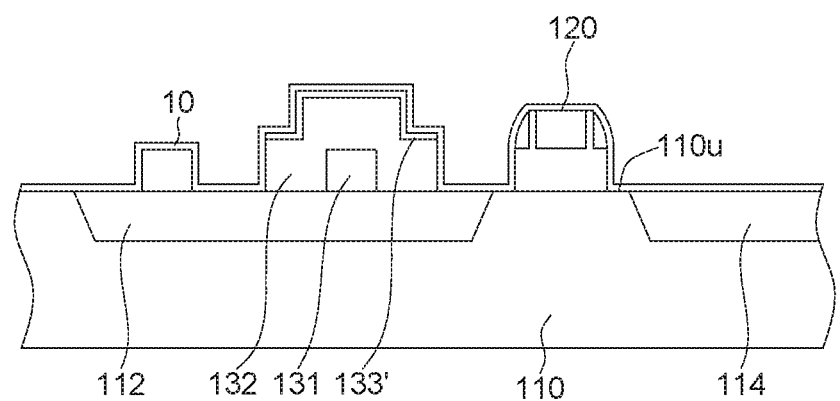

Referring to FIG. 2B, a reaction layer 10 covering the second poly layer 133', the SAB layer 132, the MOS 120, the upper surface 110u of the semiconductor substrate 110, the first isolation portion 112 and the second isolation portion 114 is formed by way of, for example, sputtering. The reaction layer 10 is, for example, titanium, nickel, copper or a combination of thereof.

Figure 2C:
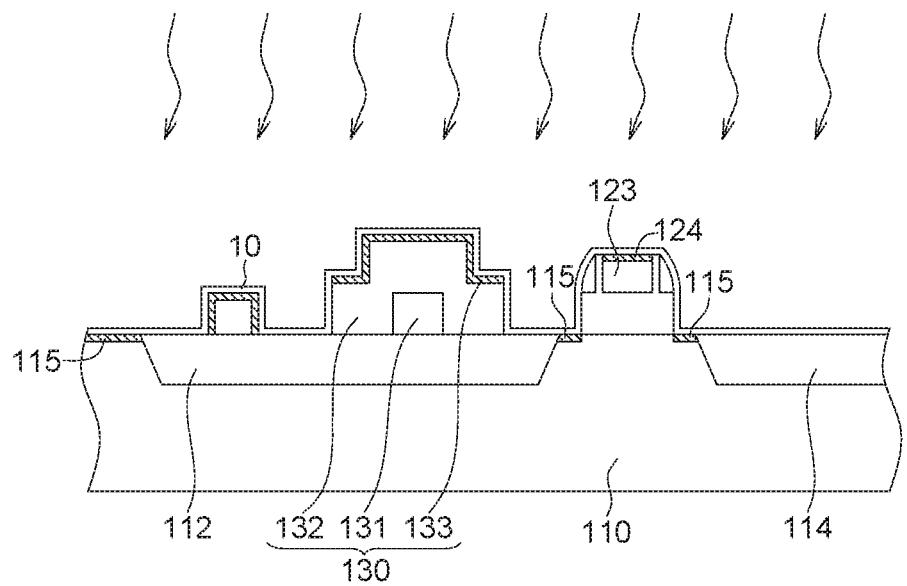

Referring to FIG. 2C, the second poly layer 133' is reacted with the reaction layer 10, by way of heating, to form the first salicide layer 133, the second salicide layer 115 and the third salicide layer 124 which are of low resistance. The first poly layer 131, the SAB layer 132 and the first salicide layer 133 constitute the passive component 130. After heating, the silicon material covered by the reaction layer 10 is reacted to form a number of salicide layers. For example, the second poly layer 133', the upper portion of the semiconductor substrate 110 and the upper portion of poly layer 123 of the MOS 120 are reacted with the reaction layer 10 to form the first salicide layer 133, the second salicide layer 115 and the third salicide layer 124 respectively in the same heating process. The first poly portion of the second poly layer 133' is reacted with the reaction layer 10 to form the first salicide portion 1331, and the second poly portion of the second poly layer 133' is reacted with the reaction layer 10 to form the second salicide portion 1332 and the third salicide portion 1333 of FIG. 1C.

Figure 2D:
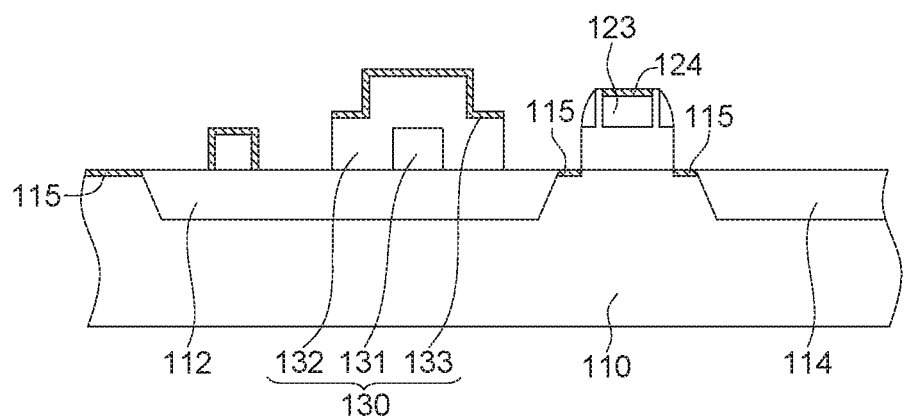

Referring to FIG. 2D, the reaction layer 10 is removed by way of, for example, etching. After reaction layer 10 is removed, the first salicide layer 133, the second salicide layer 115 and the third salicide layer 124 are exposed.

Figure 2E:
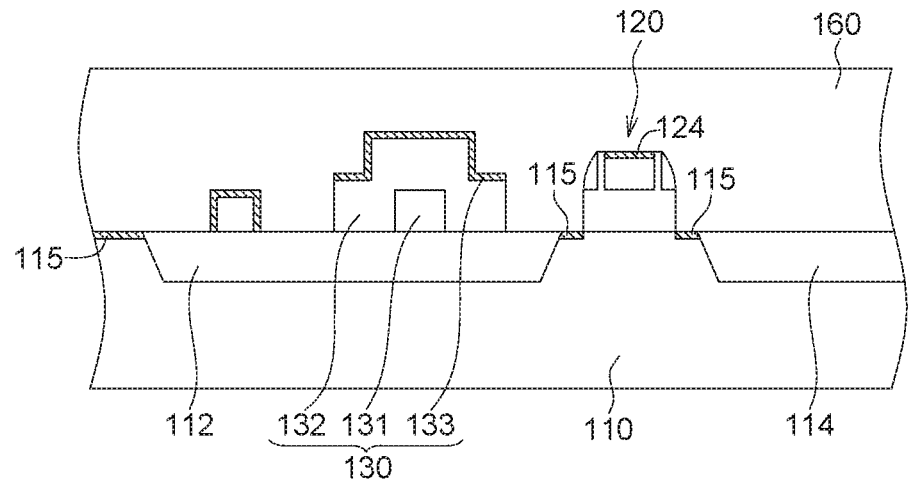

Referring to FIG. 2E, the layer structure 160 covering the MOS 120 and the passive component 130 is formed. In an embodiment, the layer structure 160 is an interlayer dielectric layer, for example.

Figure 2F:
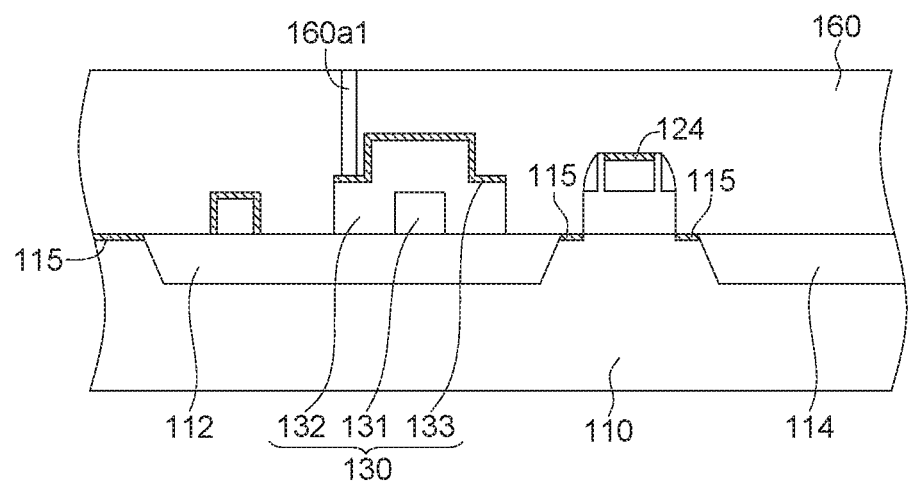

Referring to FIG. 2F, the first opening 160a1, a second opening 160a2 (as illustrated in FIG. 1C) and a third opening 160a2' (as illustrated in FIG. 1C) passing through the layer structure 160 are formed.

Then, the first opening 160a1 is filled with the first contact 140 of FIG. 1B, the second opening 160a2 (as illustrated in FIG. 1C) is filled with the second contact 150 of FIG. 1C, and the third opening 160a2' (as illustrated in FIG. 1C) is filled with the third contact 150' of FIG. 1C. The first contact 140, the second contact 150 and the third contact 150' are made of the same material, such as metal.

Then, the first conductive wire 146 for connecting the first contact 140 with the controller 145 and the second conductive wire 146 for connecting the second contact 150 with the controller 145 are formed. The controller 145 is configured to provide the passive component 130 with a constant voltage or a controllable voltage.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
   a semiconductor substrate; and
   a passive component formed on the semiconductor substrate and comprising:
   a first polysilicon (poly) layer;
   a salicide blockage (SAB) layer formed on the first poly layer; and
   a first salicide layer covering the entire upper surface of the SAB layer.

2. The semiconductor device as claimed in claim 1, further comprising:
   a first contact formed on a first upper surface of the first salicide layer and electrically connecting to a controller, wherein the controller is configured to provide the passive component with a constant voltage.

3. The semiconductor device as claimed in claim 1, further comprising:
   a first contact formed on the first salicide layer and electrically connecting to a controller, wherein the controller is configured to provide the passive component with a controllable voltage.

4. The semiconductor device as claimed in claim 1, wherein the first poly layer has a second upper surface and a first lateral surface and a second lateral surface opposite to the first lateral surface, and the SAB layer covers a portion of the second upper surface, a portion of the first lateral surface and a portion of the second lateral surface.

5. The semiconductor device as claimed in claim 1, wherein the first poly layer has a third lateral surface and a fourth lateral surface opposite to the third lateral surface, and the SAB layer exposes the third lateral surface and a fourth lateral surface.

6. The semiconductor device as claimed in claim 1, further comprising:
   a first contact formed on the first salicide layer covering the SAB layer.

7. The semiconductor device as claimed in claim 1, further comprising:
   a second contact formed on the first salicide layer covering the first poly layer.

8. The semiconductor device as claimed in claim 1, wherein the first salicide layer includes a first salicide portion and a second salicide portion, and the first salicide portion formed on the SAB layer is separated from the second salicide portion formed on the first poly layer by a third lateral surface of the SAB layer.

9. The semiconductor device as claimed in claim 1, wherein the first poly layer has a second upper surface, the SAB layer covers a first portion of the second upper surface and exposes a second portion of the second upper surface, and the first salicide layer is formed on the entire upper surface of the SAB layer and the second portion.

10. The semiconductor device as claimed in claim 1, further comprises:
    a metal-oxide-semiconductor (MOS);
    a second salicide layer formed on the MOS; and
    a third salicide layer formed on the semiconductor substrate;
    wherein the first salicide layer, the second salicide layer and the third salicide layer are the same layer structure formed in the same process.

11. The semiconductor device as claimed in claim 1, wherein the first salicide layer is formed by reacting a second poly layer with a reaction layer.

12. A semiconductor device, comprising:
    a semiconductor substrate; and
    a passive component formed on the semiconductor substrate and comprising:
    a first polysilicon (poly) layer;
    a salicide blockage (SAB) layer formed on the first poly layer; and
    a first salicide layer formed on the SAB layer;
    wherein the first poly layer has two terminal portions projected with respect to two lateral surfaces of the SAB layer respectively.

* * * * *